United States Patent
Menzel et al.

(10) Patent No.: US 8,908,951 B2
(45) Date of Patent: Dec. 9, 2014

(54) COMPLEX RECONSTRUCTION OF Q-SPACE FOR SIMULTANEOUS DETECTION OF COHERENT AND INCOHERENT MOTION

(71) Applicant: General Electric Company, Schenectady, NY (US)

(72) Inventors: Marion Irene Menzel, Munich (DE); Christopher Judson Hardy, Schenectady, NY (US); Kevin Franklin King, Menomonee Falls, WI (US); Luca Marinelli, Schenectady, NY (US); Ek Tsoon Tan, Mechanicsville, NY (US); Jonathan Immanuel Sperl, Friesing (DE)

(73) Assignee: General Electric Company, Niskayuna, NY (US)

( * ) Notice: Subject to any disclaimer, the term of this patent is extended or adjusted under 35 U.S.C. 154(b) by 197 days.

(21) Appl. No.: 13/728,871

(22) Filed: Dec. 27, 2012

(65) Prior Publication Data
US 2014/0185894 A1 Jul. 3, 2014

(51) Int. Cl.
*G06K 9/00* (2006.01)
*G06T 7/00* (2006.01)

(52) U.S. Cl.
CPC ................................. *G06T 7/0012* (2013.01)
USPC .............................................. 382/131

(58) Field of Classification Search
None
See application file for complete search history.

(56) References Cited

U.S. PATENT DOCUMENTS

| 6,614,226 | B2 * | 9/2003 | Wedeen | 324/309 |
|---|---|---|---|---|
| 7,868,615 | B2 * | 1/2011 | Li et al. | 324/309 |
| 2012/0280686 | A1 * | 11/2012 | White et al. | 324/309 |
| 2013/0113481 | A1 * | 5/2013 | Kim et al. | 324/309 |
| 2014/0185894 | A1 * | 7/2014 | Menzel et al. | 382/131 |

OTHER PUBLICATIONS

Menzel, Marion I., et al.; "Accelerated Diffusion Spectrum Imaging in the Human Brain Using Compressed Sensing"; Magnetic Resonance in Medicine 66:1226-1233, 2011.*
Scheenen, T.W.J., et al.; "Quantification of water transport in plants with NMR imaging"; Journal of Experimental Biology, Oct. 2000. vol. 51, No. 351,. pp. 1751-1759.
Khare, Kedar, et al.; "Accelerated MR Imaging Using Compressive Sensing With No Free Parameters"; Magnetic Resonance in Medicine, 68:1450-1457, 2013.
Wedeen, Van J., et al.; "Mapping Complex Tissue Architecture With Diffusion Spectrum Magnetic Resonance Imaging"; Magnetic Resonance in Medicine 54:1377-1386, 2005.
Zhu, David C., Ph.D., et al.; "Dynamics of Lateral Ventricle and Cerebrospinal Fluid in Normal and Hydrocephalic Brains"; Journal of Magnetic Resonance Imaging 24:756-770, 2006.

(Continued)

*Primary Examiner* — Tahmina Ansari
(74) *Attorney, Agent, or Firm* — Melissa K. Dobson

(57) ABSTRACT

A magnetic resonance (MR) imaging method includes acquiring MR signals having phase and magnitude at q-space locations using a diffusion sensitizing pulse sequence performed on a tissue of interest, wherein the acquired signals each include a set of complex Fourier encodings representing a three-dimensional displacement distribution of the spins in a q-space location. The signals each include information relating to coherent motion and incoherent motion in the q-space location. The method also includes determining a contribution by coherent motion to the phase of the acquired MR signals; removing the phase contribution attributable to coherent motion from the acquired MR signals to produce a complex data set for each q-space location and an image of velocity components for each q-space location; and producing a three-dimensional velocity image from the image of the velocity components.

21 Claims, 4 Drawing Sheets

(56) References Cited

OTHER PUBLICATIONS

Bernstein, Matt, et al.; Chapter 9.2, "Flow Encoding Gradients"; Handbook of MRI Pulse Sequences; pp. 281-290, Copyright 2013.

Menzel, M.L., et al.; "Accelerated diffusion spectrum imaging in the human brain using compressing sensing"; Proc. Intl. Soc. Mag. Reson. Med. 18, 2010, pp. 1698.

* cited by examiner

COMPLEX RECONSTRUCTION OF Q-SPACE FOR SIMULTANEOUS DETECTION OF COHERENT AND INCOHERENT MOTION

BACKGROUND

In general, magnetic resonance imaging (MRI) examinations are based on the interactions among a primary magnetic field, a radiofrequency (RF) magnetic field, and time varying magnetic gradient fields with gyromagnetic material having nuclear spins within a subject of interest, such as a patient. Certain gyromagnetic materials, such as hydrogen nuclei in water molecules, have characteristic behaviors in response to external magnetic fields. The precession of spins of these nuclei can be influenced by manipulation of the fields to produce RF signals that can be detected, processed, and used to reconstruct a useful image.

Techniques have been developed to perform MRI imaging sequences to generate diffusion information that might be indicative of tissue microstructure, and/or to evaluate tissue for various abnormalities, such as neural injuries, neural degenerative disorders, and so on. In diffusion imaging, information is encoded in both image space and diffusion space, the latter typically referred to in the art as q-space. Typically, q-space is utilized to detect the movement of hydrogen nuclei in water molecules. Diffusion encoding gradient pulses are utilized to characterize the three-dimensional movement of the water molecules within and between tissues—more specifically within individual voxels (each spatial location). The movement of the water molecules may be characterized as incoherent motion, which results from diffusion processes, and coherent motion, which results from tissue movement, such as during pulsation.

The data that is obtained from q-space acquisitions therefore contains data relating to both incoherent and coherent motion. Because conventional diffusion spectrum imaging (DSI) methods are concerned with the characterization of diffusion, the coherent motion is typically discarded as part of a mathematical operation utilized to facilitate data processing.

BRIEF DESCRIPTION

Certain embodiments commensurate in scope with the originally claimed invention are summarized below. These embodiments are not intended to limit the scope of the claimed invention, but rather these embodiments are intended only to provide a brief summary of possible forms of the invention. Indeed, the invention may encompass a variety of forms that may be similar to or different from the embodiments set forth below.

In one embodiment, a magnetic resonance (MR) imaging method includes acquiring MR signals having phase and magnitude at q-space locations using a diffusion sensitizing pulse sequence performed on a tissue of interest, wherein the acquired signals each include a set of complex Fourier encodings representing a three-dimensional displacement distribution of the spins in a q-space location. The signals each include information relating to coherent motion and incoherent motion in the q-space location. The method also includes determining a contribution by coherent motion to the phase of the acquired MR signals; removing the phase contribution attributable to coherent motion from the acquired MR signals to produce a complex data set for each q-space location and an image of velocity components for each q-space location; and producing a three-dimensional velocity image from the image of the velocity components.

In another embodiment, a magnetic resonance (MR) imaging system includes control and analysis circuitry programmed to: acquire MR signals having phase and magnitude at q-space locations using a diffusion sensitizing pulse sequence performed on a tissue of interest, wherein the acquired signals each include a set of complex Fourier encodings representing a three-dimensional displacement distribution of the spins in a q-space location, and the signals each include information relating to coherent motion and incoherent motion in the q-space location. The control and analysis circuitry is also programmed to determine a contribution by coherent motion to the phase of the acquired MR signals; remove the phase contribution attributable to coherent motion from the acquired MR signals to produce a complex data set for each q-space location and an image of velocity components for each q-space location; and produce a three-dimensional velocity image from the image of the velocity components.

In a further embodiment, a non-transitory, machine-readable medium is provided. The medium stores instructions executable by one or more processors to: cause an MR scanner to acquire MR signals having phase and magnitude at q-space locations using a diffusion sensitizing pulse sequence performed on a tissue of interest. The acquired signals each include a set of complex Fourier encodings representing a three-dimensional displacement distribution of the spins in a q-space location, and the signals each include information relating to coherent motion and incoherent motion in the q-space location. The instructions are also executable to cause the one or more processors to determine a contribution by coherent motion to the phase of the acquired MR signals; remove the phase contribution attributable to coherent motion from the acquired MR signals to produce a complex data set for each q-space location and an image of velocity components for each q-space location; and produce a three-dimensional velocity image from the image of the velocity components.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As noted above, conventional DSI involves the removal of coherent flow information to facilitate data processing. In particular, the complex signal (e.g., signal having both magnitude and phase) for each q-space point is operated upon to produce a so-called "modulus" of the signal. The modulus of the signal generally corresponds to the magnitude of the signal with the phase of the signal resulting from velocity components of the diffusing spins in the q-space point altogether removed. However, it may be desirable to retain such phase information to obtain a more accurate assessment of tissue structure and diffusion. In accordance with present embodiments, the phase of the signal is employed to simultaneously classify the existing motion as well as extract diffusion information from the same complex q-space data.

Figure 1:
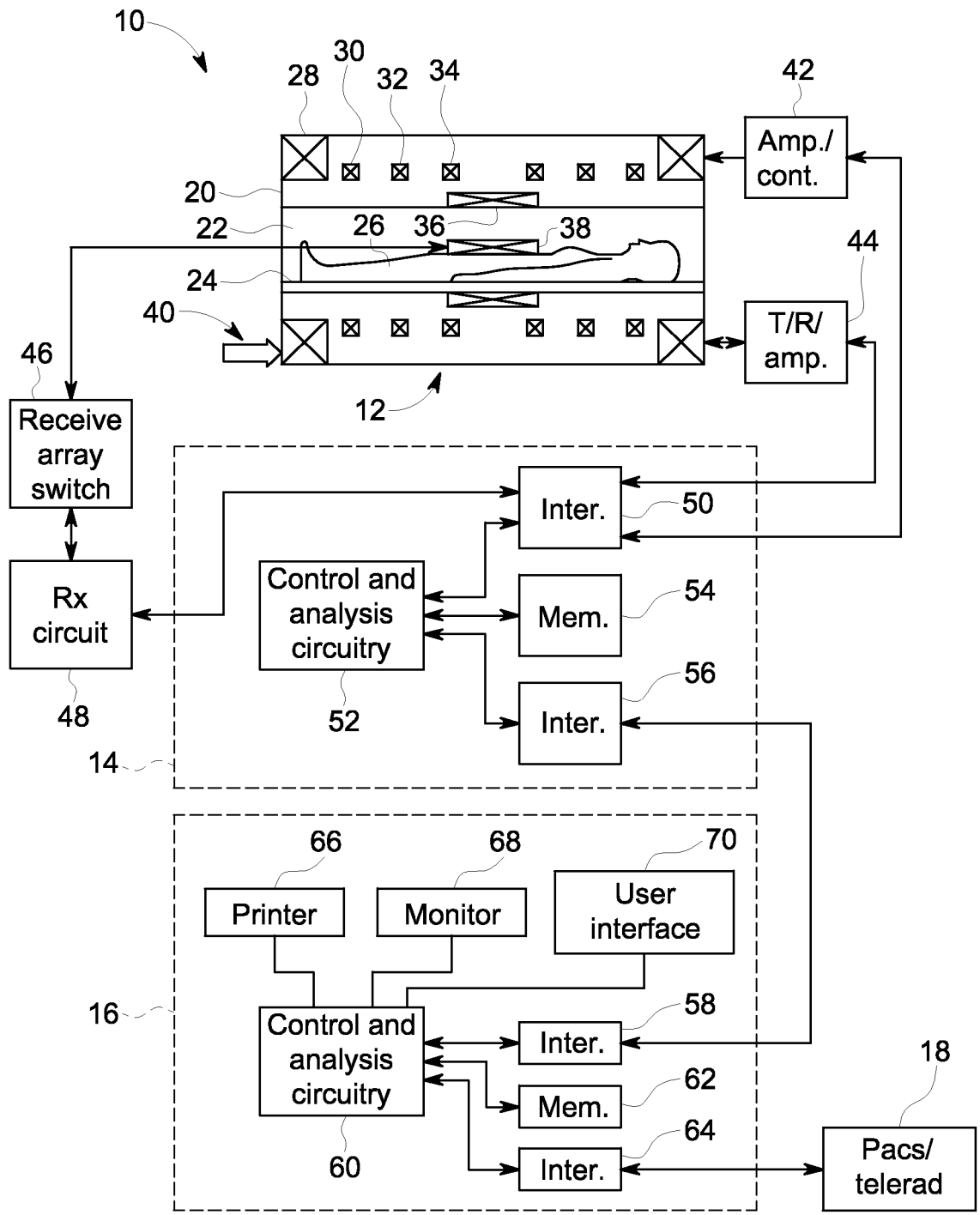
FIG. 1 is a diagrammatical illustration of an embodiment of a magnetic resonance imaging (MRI) system configured to perform diffusion imaging in accordance with an aspect of the present disclosure.

Indeed, the present embodiments enable the simultaneous assessment of coherent and incoherent motion on scales demonstrated in biological tissue. Additionally, the present technique retains the Gaussian noise properties inherent in a complex MRI acquisition, which reduces magnitude-induced bias on the quantification of diffusion MRI data. This results in a more accurate estimation of data driven metrics on incoherent (diffusion or kurtosis) or coherent motion than would be obtained using modulus-based reconstruction methods The embodiments described herein may be performed by a magnetic resonance imaging (MRI) system, wherein specific imaging routines (e.g., diffusion MRI sequences) are initiated by a user (e.g., a radiologist). Thus, the MRI system may perform data acquisition, data construction, and image synthesis. Accordingly, referring to FIG. 1, a magnetic resonance imaging system 10 is illustrated schematically as including a scanner 12, scanner control circuitry 14, and system control circuitry 16. According to the embodiments described herein, the MRI system 10 is generally configured to perform MR imaging, such as imaging sequences for diffusion imaging, T1, T2, proton density (PD) weighting, fluid attenuation, and so on. System 10 additionally includes remote access and storage systems or devices such as picture archiving and communication systems (PACS) 18, or other devices such as teleradiology equipment so that data acquired by the system 10 may be accessed on- or off-site. In this way, MR data may be acquired, followed by on- or off-site processing and evaluation. While the MRI system 10 may include any suitable scanner or detector, in the illustrated embodiment, the system 10 includes a full body scanner 12 having a housing 20 through which a bore 22 is formed. A table 24 is moveable into the bore 22 to permit a patient 26 to be positioned therein for imaging selected anatomy within the patient.

Scanner 12 includes a series of associated coils for producing controlled magnetic fields for exciting the gyromagnetic material within the anatomy of the subject being imaged. Specifically, a primary magnet coil 28 is provided for generating a primary magnetic field, $B_0$, which is generally aligned with the bore 22. A series of gradient coils 30, 32, and 34 permit controlled magnetic gradient fields to be generated for positional encoding of certain of the gyromagnetic nuclei within the patient 26 during examination sequences. A radio frequency (RF) coil 36 is provided, and is configured to generate radio frequency pulses for exciting the certain gyromagnetic nuclei within the patient. In addition to the coils that may be local to the scanner 12, the system 10 also includes a set of receiving coils 38 (e.g., an array of coils) configured for placement proximal (e.g., against) the patient 26. As an example, the receiving coils 38 can include cervical/thoracic/lumbar (CTL) coils, head coils, single-sided spine coils, and so forth. Generally, the receiving coils 38 are placed close to or on top of the patient 26 so as to receive the weak RF signals (weak relative to the transmitted pulses generated by the scanner coils) that are generated by certain of the gyromagnetic nuclei within the patient 26 as they return to their relaxed state.

The various coils of system 10 are controlled by external circuitry to generate the desired field and pulses, and to read emissions from the gyromagnetic material in a controlled manner. In the illustrated embodiment, a main power supply 40 provides power to the primary field coil 28. A driver circuit 42 is provided for pulsing the gradient field coils 30, 32, and 34. Such a circuit may include amplification and control circuitry for supplying current to the coils as defined by digitized pulse sequences output by the scanner control circuit 14, which in one embodiment may be a diffusion imaging module. Another control circuit 44 is provided for regulating operation of the RF coil 36. Circuit 44 includes a switching device for alternating between the active and inactive modes of operation, wherein the RF coil 36 transmits and does not transmit signals, respectively. Circuit 44 also includes amplification circuitry for generating the RF pulses. Similarly, the receiving coils 38 are connected to switch 46, which is capable of switching the receiving coils 38 between receiving and non-receiving modes. Thus, the receiving coils 38 resonate with the RF signals produced by relaxing gyromagnetic nuclei from within the patient 26 while in the receiving mode, and they do not resonate with RF energy from the transmitting coils (i.e., coil 36) so as to prevent undesirable operation while in the non-receiving mode. Additionally, a receiving circuit 48 is provided for receiving the data detected by the receiving coils 38, and may include one or more multiplexing and/or amplification circuits.

It should be noted that while the scanner 12 and the control/amplification circuitry described above are illustrated as being coupled by a single line, that many such lines may occur in an actual instantiation. For example, separate lines may be used for control, data communication, and so on. Further, suitable hardware may be disposed along each type of line for the proper handling of the data. Indeed, various filters, digitizers, and processors may be disposed between the scanner and either or both of the scanner and system control circuitry 14, 16. By way of non-limiting example, certain of the control and analysis circuitry described in detail below, although illustrated as a single unit, includes additional hardware such as image reconstruction hardware configured to perform the data processing techniques described herein.

As illustrated, scanner control circuit 14 includes an interface circuit 50, which outputs signals for driving the gradient field coils and the RF coil and for receiving the data representative of the magnetic resonance signals produced in examination sequences. The interface circuit 50 is coupled to a control and analysis circuit 52. The control and analysis circuit 52 executes the commands for driving the circuit 42 and circuit 44 based on defined protocols selected via system control circuit 16. Control and analysis circuit 52 also serves to receive the magnetic resonance signals and performs subsequent processing before transmitting the data to system control circuit 16. Scanner control circuit 14 also includes one or more memory circuits 54, which store configuration parameters, pulse sequence descriptions, examination results, and so forth, during operation. As noted above, in one embodiment, the scanner control circuit 14 may correspond to all or a part of a diffusion imaging module.

Interface circuit 56 is coupled to the control and analysis circuit 52 for exchanging data between scanner control circuit 14 and system control circuit 16. In certain embodiments, the control and analysis circuit 52, while illustrated as a single unit, may include one or more hardware devices. Further, in certain embodiments, system control circuit 16 may be a part of the diffusion imaging module. The system control circuit 16 includes an interface circuit 58, which receives data from the scanner control circuit 14 and transmits data and commands back to the scanner control circuit 14. The interface circuit 58 is coupled to a control and analysis circuit 60 which may include a CPU in a multi-purpose or application specific computer or workstation. Control and analysis circuit 60 is coupled to a memory circuit 62 to store programming code for operation of the MRI system 10 and to store the processed image data for later reconstruction, display and transmission. The programming code may execute one or more algorithms that, when executed by a processor, are configured to perform complex reconstruction of acquired q-space data to obtain both coherent and incoherent motion data. An additional interface circuit 64 may be provided for exchanging image data, configuration parameters, and so forth with external system components such as remote access and storage devices 18. Finally, the system control and analysis circuit 60 may include various peripheral devices for facilitating operator interface and for producing hard copies of the reconstructed images. In the illustrated embodiment, these peripherals include a printer 60, a monitor 62, and user interface 64 including devices such as a keyboard or a mouse.

It should be noted that the MRI system described is merely intended to be exemplary only, and other system types, such as so-called "open" MRI systems may also be used. Similarly, such systems may be rated by the strength of their primary magnet, and any suitably rated system capable of carrying out the data acquisition and processing described below may be employed. Indeed, at least a portion of the disclosed methods may be performed by the system 10 described above with respect to FIG. 1. That is, the MRI system 10 may perform the acquisition techniques described herein, and, in some embodiments, the data processing techniques described herein. It should be noted that subsequent to the acquisitions described herein, the system 10 may simply store the acquired data for later access locally and/or remotely, for example in a memory circuit (e.g., memory 62). Thus, when accessed locally and/or remotely, the acquired data may be manipulated by one or more processors contained within an application-specific or general-purpose computer. The one or more processors may access the acquired data and execute routines stored on one or more non-transitory, machine readable media collectively storing instructions for performing methods including the diffusion imaging methods described herein.

Figure 2:
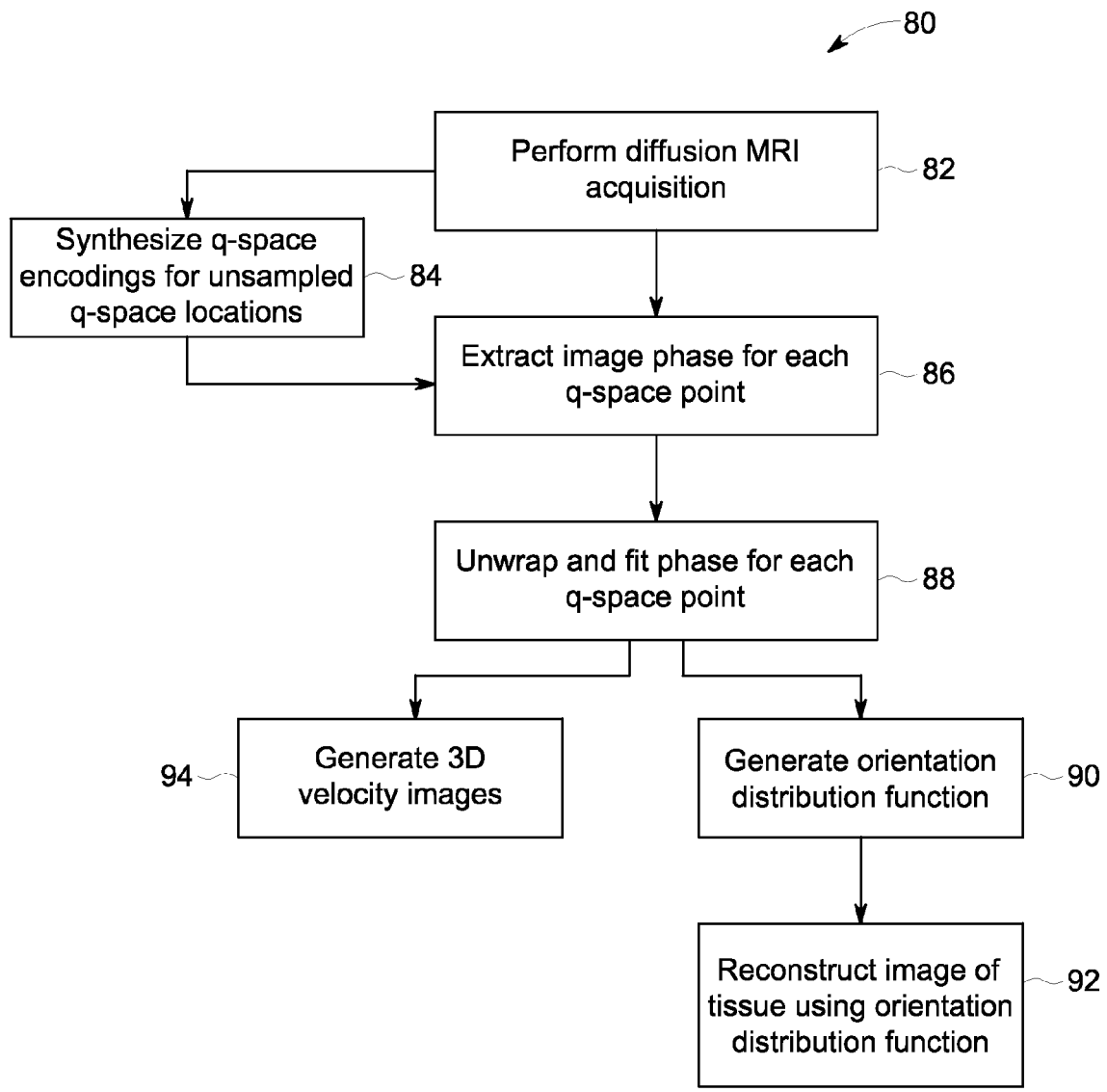
FIG. 2 is a process flow diagram depicting an embodiment of a method for obtaining both coherent and incoherent motion data from the complex q-space data collected by the system of FIG. 1, in accordance with an aspect of the present disclosure.

One such method 80 is illustrated as a process flow diagram in FIG. 2. In particular, method 80 includes a number of steps intended to analyze complex q-space data (i.e., q-space data including phase information) to characterize both incoherent (i.e., diffusive and perfusive) motion and coherent (i.e., flow, pulsatile) motion. Accordingly, it should be noted that the method 80 includes retaining the phase information contained in the complex q-space data so as to enable the characterization of the coherent motion.

The method 80 begins with performing a diffusion MRI acquisition (block 82). The acquisition may be any suitable diffusion pulse sequence for acquiring data in the form of a set of signals from a three-dimensional region of interest (e.g., a tissue of the patient). By way of non-limiting example, the acquisition may include a spin-echo or double-spin-echo echo-planar imaging pulse sequence having diffusion-sensitizing gradient pulses. The pulse sequence produces a series of MR images (after complex Fourier transformation in k-space), with each image representing one point in the reciprocal space of diffusion—q-space. The images constitute a complex diffusion-encoded data set containing phase information relating to both incoherent and coherent motion, such as motion resulting from pulsatile tissue—i.e., blood or cerebrospinal fluid (CSF) flow. The acquired signal at each the q-space locations represent the three-dimensional displacement distribution of the spins of the gyromagnetic material (e.g., protons in water) in each voxel. The signals obtained according to block 82 include diffusion encoding through a set of randomly distributed encoding gradients representative of a three-dimensional displacement probability distribution function of the spins in the imaged volume.

The most comprehensive diffusion information is typically obtained using an acquisition that satisfies the Nyquist criterion. The acquisition according to block 82 will typically be of a high dimensionality—including three dimensions in the spatial domain and three dimensions in the q-space domain, and in certain embodiments may be performed at the Nyquist rate. Accordingly, the scan time for certain sequences may be relatively long. To reduce scan time, in other embodiments, less than all of the q-space data may be acquired. In other words, as an alternative acquisition method, the q-space data may be sampled under the Nyquist rate. The acquisition trajectory employed in such embodiments may be any suitable trajectory, such as a non-uniform (e.g., a random or pseudo-random) pattern, a regularly sampled pattern of sparsely sampled locations, and so on. In one embodiment, the pattern may not be evenly distributed.

In embodiments where less than the total available q-space locations are sampled, the method 80 may include synthesizing q-space encodings for unsampled q-space locations (block 84) so as to produce a set of uniformly distributed q-space data points. For example, while parallel imaging reconstruction techniques could potentially be utilized for synthesizing missing spatial data, due to the random or pseudo-random nature of the undersampling pattern, it may be desirable to utilize other techniques, such as compressed sensing, so as to enable the synthesis of missing q-space data. As will be understood by those of skill in the art, compressed sensing is a technique in which data is both acquired and then reconstructed. Accordingly, the sampling in accordance with block 82 may be a pattern that is amenable to reconstruction using a compressed sensing algorithm. While any suitable compressed sensing algorithm may be used for reconstruction, in one embodiment, the reconstruction may be performed using a non-linear reconstruction scheme. However, it should be noted that any suitable method for undersampling and concomitant reconstruction may be utilized in conjunction with the techniques described herein for complex q-space reconstruction.

Upon acquisition and, if appropriate, synthesis of the desired q-space data locations, the method 80 progresses to the extraction of the image phase for each q-space data point (block 86). It should be noted that the extraction of the image phase does not include the removal of the phase data. Rather, as those of skill in the art will appreciate, the image phase extraction results in a phase image for every q-space point, which may be subjected to further processing steps, as discussed in detail below. Any suitable technique may be used for phase extraction in accordance with block 86. By way of non-limiting example, such techniques may include taking the arc-tangent of the imaginary component divided by the real component.

Because the phase of the complex q-space data maybe aliased beyond the range of −pi to +pi, the phase images may be wrapped (i.e., aliased). Furthermore, because the data is complex, it also includes phase data related to background noise (e.g., due to $B_0$ inhomogeneity). Accordingly, a series of processing steps may be performed, depicted generically at block 88, for unwrapping and fitting the phase for each q-space point. One embodiment of the manner in which the acts according to block 88 are performed is discussed in further detail below with respect to FIG. 3.

Generally, the acts according to block 88 will function to remove background phase, to unwrap the phase, and will also, in accordance with present embodiments, enable the separation and characterization of both incoherent and coherent motion in the tissue being imaged. Accordingly, subsequent to the steps performed according to block 88, the method 80 includes a series of parallel processes performed on the separated data sets. These parallel processes are discussed in further detail with respect to FIGS. 3 and 4 below.

As an example, the data relating to the incoherent motion may be utilized to generate a function that represents a probability distribution of spin displacements at a given echo time—specifically for diffusion-related processes. As understood by those of skill in the art, an orientation distribution function (ODF) may be generated from the probability distribution function (block 90). In particular, the ODF is the angular component of the probability distribution function, and reflects the underlying tissue anisotropy. Accordingly, the ODF may be utilized to reconstruct an image of the tissue (block 92).

As noted above, the method 80 also produces data related to coherent motion, which may be processed in parallel to the data related to the incoherent motion. Specifically, the data related to coherent motion may be utilized to generate 3D velocity images (block 94), which may be useful for characterizing the flow of blood, cerebrospinal fluid (CSF), pulsatile motion, and the like.

Figure 3:
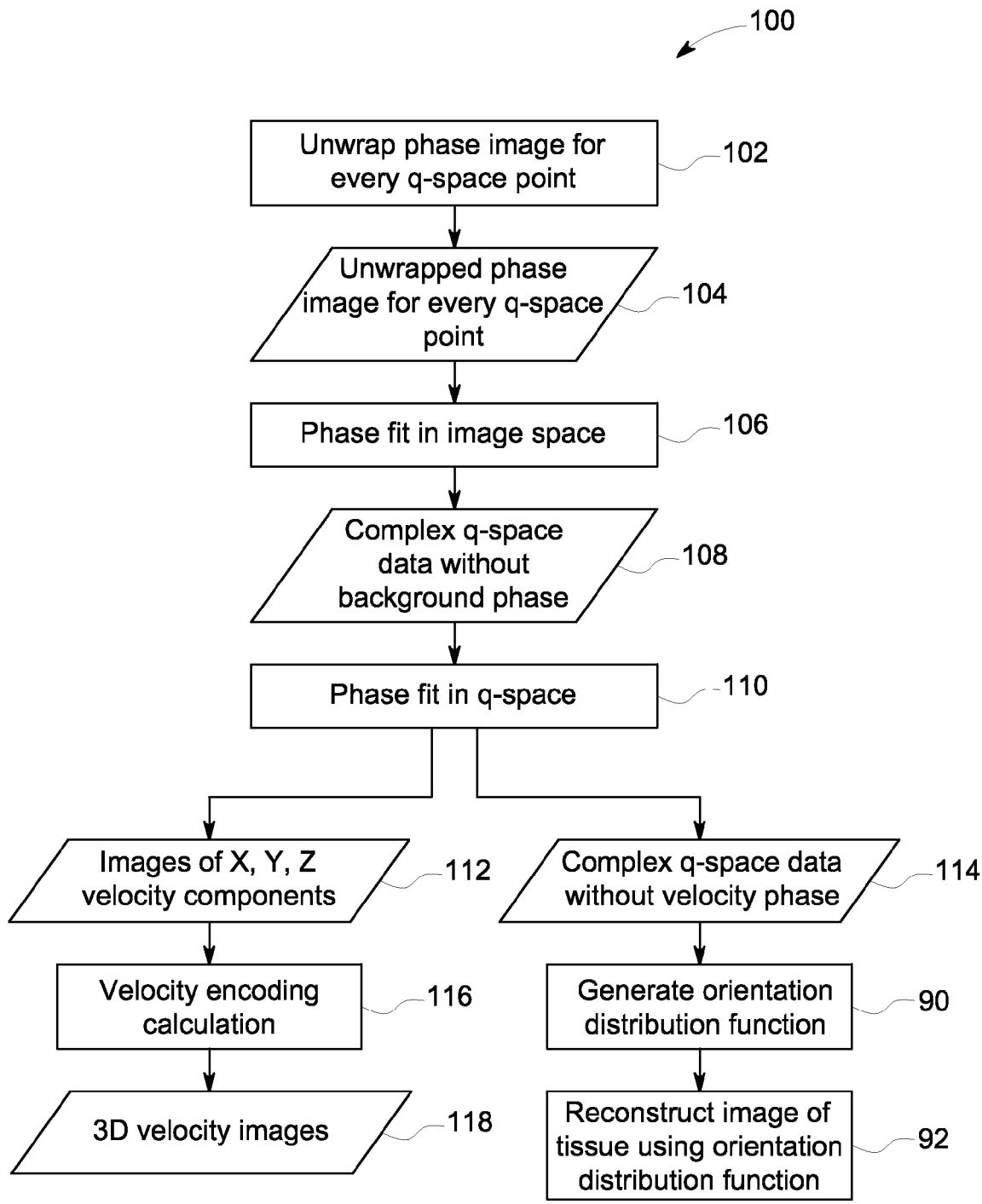
FIG. 3 is a process flow diagram depicting an embodiment of a method for processing the complex q-space data in a manner that enables the characterization of coherent motion, in accordance with an aspect of the present disclosure.

The manner in which the phase information is processed may be better understood with reference to FIG. 3, which is a process flow diagram illustrating an embodiment of a method 100 for processing complex q-space data sets having velocity phase information. The method 100 may be considered to begin at block 88 of method 80, after the image phase is extracted for each q-space point at block 86.

While it may be possible and desirable to image the tissue of interest using a suitably-sized field of view (FOV), such imaging acquisitions may be time-consuming. Because q-space imaging represents a longer-than-average imaging time compared to traditional MRI, it may be desirable to reduce the FOV to a size that provides sufficient coverage while also enabling some degree of de-aliasing. In such embodiments, as noted above with respect to FIG. 2, the FOV may be sized such that phase of the complex q-space data may be aliased beyond the range of −pi to +pi. Accordingly, in the illustrated embodiment, the images may be de-aliased using any suitable phase unwrapping technique (block 102). By way of non-limiting example, such techniques may include finding image regions that experience aliasing in phase, and subtracting or adding even multiples of pi to the original phase. The result of these acts is an unwrapped, continuous phase image for every q-space point (data 104). The data 104 can have phase values beyond the range of −pi to +pi. In some embodiments, the unwrapped phase images may be displayed.

The unwrapped phase images (data 104) may also include background phase having low spatial variation, which can be attributable to motion that is not of physiologic interest, to measurement imperfections (e.g., $B_0$ inhomogeneity), and the like. Accordingly, the background phase may be removed by fitting the phase of the signal in the image space for every q-space point (block 106). By way of non-limiting example, the phase, φ may be fit using any suitable polynomial of any suitable order, such as first, second third, and so on. In one embodiment, a second order polynomial may be used for the fit according to the equation:

$$\phi = p_{00} + p_{10}x + p_{01}y + p_{20}x^2 + p_{11}xy + p_{02}y^2 \quad (1)$$

The acts according to block 106 remove the phase in the image via phase correction for slowly varying phase on the basis of the coefficients in the polynomial. The acts in block 106 therefore produce phase-unwrapped, complex q-space data with background phase correction (data 108).

As noted above, the q-space data obtained according to the methods described herein is complex, and includes information relating to coherent and incoherent motion. Thus, the complex q-space data enables the separation and characterization of these types of motion in the imaged tissue. For example, perfusion (non-directional motion) should result in a fast decay, for example via the intravoxel-incoherent motion phenomenon with b-values less than 100 $mm^2/s$, followed by diffusive signal decay for higher b-values. On the other hand, coherent flow (e.g., tissue motion, which is directional) may result in a non-zero phase contribution in the q-space domain or an off-center shift of the center of the displacement propagator and loss of symmetry in the displacement domain. Accordingly, the incoherent and coherent flows each have different contributions to the phase of the signal in each q-space point.

The phase contribution of the coherent motion can be determined by performing a series of steps discussed herein. As illustrated in FIG. 3, the signal phase, φ attributable to the coherent motion may be fit in q-space (block 110). For example, the fit may be performed using any suitable polynomial of any suitable order, such as first, second, third, and so on. By way of non-limiting example, a first-order polynomial may be used for the fit according to the equation:

$$\phi = p_{000} + p_{100}x + p_{010}y + p_{001}z \quad (2)$$

During or after the fitting, the phase contribution by the coherent motion may be removed on the basis of the polynomial fit coefficients to produce images of coefficients from the q-space phase fit (i.e., images of the x, y, z velocity components) (data 112) and a complex data set for every q-space point (data 114) having no phase contribution from the coherent motion and background gradients. Using the images of the x, y, z velocity components (data 112), a velocity encoding calculation (VENC) may be performed on every q-space point (block 116) to produce a series of 3D velocity images (data 118). The velocity images may be used to characterize, for example, the velocity of cerebrospinal fluid in the MR images, and/or motion correction in brain images. Furthermore, it is presently contemplated that such images may be obtained for other anatomies that are amenable to similar characterizations.

Figure 4:
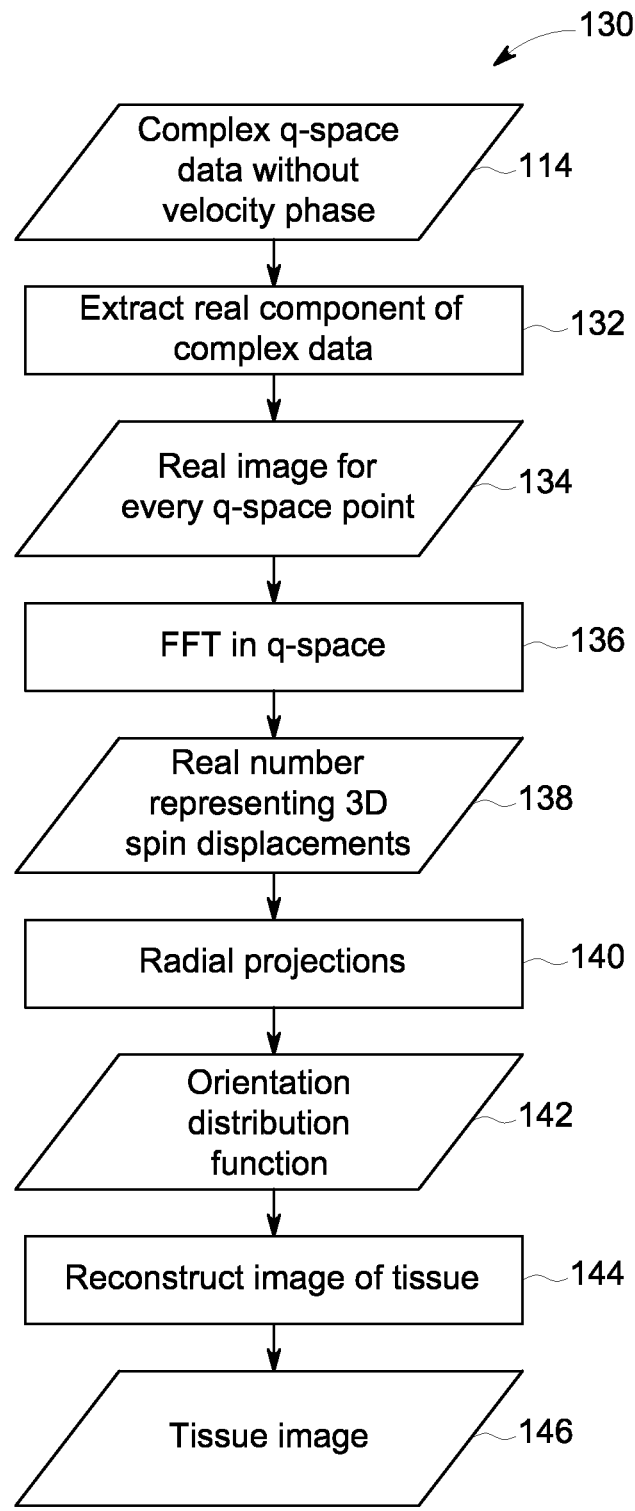
FIG. 4 is a process flow diagram depicting an embodiment of a method for processing the complex q-space data in a manner that enables the characterization of incoherent motion, in accordance with an aspect of the present disclosure.

The complex data set for every q-space point (data 114) may be processed according to a method 130, which is illustrated diagrammatically in FIG. 4. As noted above, because the reconstruction methods of the present embodiments retain the Gaussian noise properties inherent in a complex MRI acquisition, the magnitude-induced bias on the quantification of diffusion MRI data is reduced or altogether avoided. In other words, the present embodiments retain a true distribution of noise. This results in a more accurate estimation of data driven metrics on incoherent (diffusion or kurtosis) motion than would be obtained using modulus-based reconstruction methods. Accordingly, it should be noted that the data that is processed in accordance with method 130 may enable a more accurate estimation of incoherent motion when compared to such methods.

Starting with the complex q-space data with removed velocity and background phase (data 114), the real component of the complex data is extracted (block 132) to produce a real image for every q-space point (data 134). It should be noted that the real images (data 134) may be similar to a magnitude image obtained from modulus-based methods. However, the complex data also enables the evaluation of higher-order diffusion properties, such as kurtosis.

In some embodiments, the complex q-space data (data 134) may be transformed (e.g., via fast Fourier transform) in q-space (block 136) to produce a real number representing three-dimensional spin displacements (data 138) for each point in q-space. The data is further processed by integrating over a set of weighted reconstructions of the diffusion propagator (block 140) to produce an orientation distribution function (ODF) (data 142). The ODF (data 142) may then be utilized to reconstruct (block 144) one or more images (data 146), such as the structure of the tissue being imaged. It should be appreciated by those of skill in the art that other images may be produced from the complex q-space data, such as images representing angular diffusion characteristics, radial diffusion characteristics, and the like.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A magnetic resonance (MR) imaging method, comprising:
   acquiring MR signals having phase and magnitude at q-space locations using a diffusion sensitizing pulse sequence performed on a tissue of interest, wherein the acquired signals each comprise a set of complex Fourier encodings representing a three-dimensional displacement distribution of the spins in a q-space location, and the signals each comprise information relating to coherent motion and incoherent motion in the q-space location;
   determining a contribution by coherent motion to the phase of the acquired MR signals;
   removing the phase contribution attributable to coherent motion from the acquired MR signals to produce a complex data set for each q-space location and an image of velocity components for each q-space location; and
   producing a three-dimensional velocity image from the image of the velocity components.

2. The method of claim 1, wherein determining the contribution by coherent motion to the phase of the acquired MR signals comprises fitting the phase of the signal in q-space using a polynomial function to obtain polynomial fit coefficients corresponding to the coherent motion.

3. The method of claim 2, wherein the polynomial fit coefficients correspond to the images of the velocity components.

4. The method of claim 2, wherein removing the phase contribution attributable to coherent motion from the acquired MR signals comprises removing the phase contribution attributable to coherent motion on the basis of the polynomial fit coefficients.

5. The method of claim 2, wherein producing the three-dimensional velocity image form the image of the velocity components comprises performing a velocity encoding calculation on the image of the velocity components.

6. The method of claim 1, wherein the complex data set for each q-space location retains the Gaussian noise properties obtained from the acquisition.

7. The method of claim 1, comprising generating an orientation distribution function from the complex data sets after extracting real components of the complex data, and generating a structural image of the tissue using the orientation distribution function.

8. The method of claim 1, wherein acquiring MR signals at q-space locations using the diffusion sensitizing pulse sequence comprises acquiring MR signals at undersampled q-space locations for a plurality of q-space locations that is less than an entirety of the q-space locations.

9. The method of claim 8, comprising synthesizing q-space encodings using a compressed sensing technique for q-space locations in which MR signals were not acquired.

10. The method of claim 1, comprising de-aliasing the phase of the signal for every q-space location by phase unwrapping.

11. The method of claim 1, comprising removing background phase from the acquired MR signals using a polynomial function to fit the acquired MR signal phase to image space.

12. A magnetic resonance (MR) imaging system, comprising:
   control and analysis circuitry programmed to:
      acquire MR signals having phase and magnitude at q-space locations using a diffusion sensitizing pulse sequence performed on a tissue of interest, wherein the acquired signals each comprise a set of complex Fourier encodings representing a three-dimensional displacement distribution of the spins in a q-space location, and the signals each comprise information relating to coherent motion and incoherent motion in the q-space location;
      determine a contribution by coherent motion to the phase of the acquired MR signals;
      remove the phase contribution attributable to coherent motion from the acquired MR signals to produce a complex data set for each q-space location and an image of velocity components for each q-space location; and produce a three-dimensional velocity image from the image of the velocity components.

13. The MR imaging system of claim 12, wherein the control and analysis circuitry is configured to determine the contribution by coherent motion to the phase of the acquired MR signals by fitting the phase of the signal in q-space using a polynomial function to obtain polynomial fit coefficients corresponding to the coherent motion, and the polynomial fit coefficients correspond to the images of the velocity components.

14. The MR imaging system of claim 13, wherein the control and analysis circuitry is configured to remove the phase contribution attributable to coherent motion from the acquired MR signals by removing the phase contribution attributable to coherent motion on the basis of the polynomial fit coefficients.

15. The MR imaging system of claim 12, wherein the control and analysis circuitry is configured to acquire MR signals at undersampled q-space locations for a plurality of q-space locations that is less than an entirety of the q-space locations, and is configured to synthesize q-space encodings using a compressed sensing technique for q-space locations in which MR signals were not acquired.

16. The MR imaging system of claim 12, wherein the control and analysis circuitry is configured to generate an orientation distribution function from the complex data sets after extracting real components of the complex data, and generate a structural image of the tissue using the orientation distribution function.

17. A non-transitory, machine-readable medium storing instructions executable by one or more processors to:

cause an MR scanner to acquire MR signals having phase and magnitude at q-space locations using a diffusion sensitizing pulse sequence performed on a tissue of interest, wherein the acquired signals each comprise a set of complex Fourier encodings representing a three-dimensional displacement distribution of the spins in a q-space location, and the signals each comprise information relating to coherent motion and incoherent motion in the q-space location;

determine a contribution by coherent motion to the phase of the acquired MR signals;

remove the phase contribution attributable to coherent motion from the acquired MR signals to produce a complex data set for each q-space location and an image of velocity components for each q-space location; and produce a three-dimensional velocity image from the image of the velocity components.

18. The non-transitory, machine-readable medium of claim 17, wherein the stored instructions are executable by the one or more processors to determine the contribution by coherent motion to the phase of the acquired MR signals by fitting the phase of the signal in q-space using a polynomial function to obtain polynomial fit coefficients corresponding to the coherent motion, and the polynomial fit coefficients correspond to the images of the velocity components.

19. The non-transitory, machine-readable medium of claim 18, wherein the stored instructions are executable by the one or more processors to remove the phase contribution attributable to coherent motion from the acquired MR signals by removing the phase contribution attributable to coherent motion on the basis of the polynomial fit coefficients.

20. The non-transitory, machine-readable medium of claim 17, wherein the stored instructions are executable by the one or more processors to cause the MR scanner to acquire MR signals at undersampled q-space locations for a plurality of q-space locations that is less than an entirety of the q-space locations, and are executable by the one or more processors to synthesize q-space encodings using a compressed sensing technique for q-space locations in which MR signals were not acquired.

21. The non-transitory, machine-readable medium of claim 17, wherein the stored instructions are executable by the one or more processors to generate an orientation distribution function from the complex data sets after extracting real components of the complex data, and generate a structural image of the tissue using the orientation distribution function.

\* \* \* \* \*

UNITED STATES PATENT AND TRADEMARK OFFICE
CERTIFICATE OF CORRECTION

PATENT NO.       : 8,908,951 B2                                 Page 1 of 1
APPLICATION NO.  : 13/728871
DATED            : December 9, 2014
INVENTOR(S)      : Menzel et al.

It is certified that error appears in the above-identified patent and that said Letters Patent is hereby corrected as shown below:

On the Title Page, in item (72), under "Inventors", in Column 1, Line 7, delete "Friesing" and insert
-- Freising --, therefor.

In the Specification

In Column 5, Line 46, delete "printer 60, a monitor 62, and user interface 64" and insert
-- printer 66, a monitor 68, and user interface 70 --, therefor.

Signed and Sealed this
Seventh Day of April, 2015

Michelle K. Lee
*Director of the United States Patent and Trademark Office*